United States Patent [19]

Gibbs

[11] Patent Number: 5,633,092
[45] Date of Patent: May 27, 1997

[54] MAGNETOSTRICTIVE MATERIAL

[75] Inventor: Michael R. J. Gibbs, Sheffield, England

[73] Assignee: British Technology Group Ltd., London, England

[21] Appl. No.: 442,297

[22] Filed: May 16, 1995

Related U.S. Application Data

[63] Continuation of Ser. No. 244,755, filed as PCT/GB92/02275 Dec. 9, 1992, abandoned.

[30] Foreign Application Priority Data

Dec. 10, 1991 [GB] United Kingdom .................. 9126207

[51] Int. Cl.$^6$ .................................... B32B 15/01
[52] U.S. Cl. .................. 428/611; 428/336; 428/469; 428/635; 428/649; 428/650; 428/668; 428/672; 428/673; 428/680; 428/681; 428/692; 428/693; 428/900; 428/928; 360/113; 204/192.2; 204/192.22; 427/8; 427/131; 427/547; 427/548
[58] Field of Search .................................... 428/928, 611, 428/635, 649, 650, 668, 672, 673, 680, 681, 469, 694 TM, 900, 336, 692, 693; 360/113; 73/862.333; 427/8, 131, 548, 547; 204/192.2, 192.22

[56] References Cited

U.S. PATENT DOCUMENTS

| | | | |
|---|---|---|---|
| 4,663,607 | 5/1987 | Kitada et al. | 338/32 H |
| 4,727,757 | 3/1988 | Hilzinger et al. | 73/862.36 |
| 4,775,576 | 10/1988 | Bouchand et al. | 428/216 |
| 4,809,109 | 2/1989 | Howard et al. | 360/113 |
| 4,897,318 | 1/1990 | Sakakima et al. | 428/635 |
| 4,945,765 | 8/1990 | Roszhart | 73/517 |
| 5,068,022 | 11/1991 | Carcia | 204/192.15 |
| 5,087,340 | 2/1992 | Onagi et al. | 204/192.2 |
| 5,134,533 | 7/1992 | Friedrich et al. | 428/611 |
| 5,159,513 | 10/1992 | Dieny et al. | 360/113 |
| 5,168,760 | 12/1992 | Wun-Fogle et al. | 73/779 |
| 5,206,590 | 4/1993 | Dieny et al. | 324/252 |
| 5,287,238 | 2/1994 | Baumgart | 360/113 |

FOREIGN PATENT DOCUMENTS

| | | |
|---|---|---|
| 103352 | 3/1984 | European Pat. Off. |
| 1479400 | 5/1977 | United Kingdom . |

OTHER PUBLICATIONS

S. Araki et al., "Giant Magnetoresistance and Oscillartory Magnetic Coupling of Evaporated and MBE-Grown Co/Ag Multilayers," Journal of the Physical Society of Japan, vol. 60, No. 9, Sep. 1991, pp. 2827-2830.

J. Wenda et al, "Measurement of the Saturation Magnetostriction of a Thin Amorphous Film by Means of Small Angle Magnetization Oscillation", Electronics and Optics, Thin Solid Films, 148, 1987, pp. 1-6.

International Magnetics Conference Apr. 17-20, 1990, Brighton UK, H. Szymczak et al "Magnetostriction of Multilayer Co/Ag Films p. HD-09" See the whole document.

(List continued on next page.)

Primary Examiner—Stevan A. Resan
Attorney, Agent, or Firm—Cushman, Darby & Cushman IP Group of Pillsbury Madison & Sutro LLP

[57] ABSTRACT

A magnetic material of at least two component parts arranged to have respective structures which mutually are not homogenous, the structure of one part cooperating with the structure of the other to assist the magnetostrictive behaviour of the material. The cooperation can be the structure of one part altering the atomic spacing of the other part. The alteration can be an increase from the usual atomic spacing. There can be contiguous component parts and the cooperation can be a pseudo free surface on at least one part or a reduced restriction of the local moment otherwise achieved by the contiguous component parts. A component can be at least partly an alloy and the alloy can have a ratio other than the usual one for the alloy. One of the components can be non-magnetic.

38 Claims, 6 Drawing Sheets

OTHER PUBLICATIONS

International Magnetics Conference, Apr. 17–20, 1990, Brighton UK, H.Awano et al. "Magnetostriction and In–Situ measurement of stress of Co/Pd compositionally modulated multilayer films during fabrication p. HC–08".

Narita, et al: "Measurement of Saturation Magnetostriction of a Thin Amorphous Ribbon by Means of Small–Angle Magnetization Rotation", IEEE Transactions on Magnetics, vol.Mag.16, No. 2, Mar. 1980, pp. 435–439.

Dirne, et al: "Interface Mixing in Fe/Co Multilayers", Hournal of Magnetism and Magnetic Matierlas, 78 (1989) 122–128.

De Wit et al: "Nanocrystalline Materials for Video Recorder Heads",Advanced Materials,3(1991) No. 7/8 pp. 356–360.

Zepler et al: "Co/Pt Multilayers for Magneto–Optical Recording", Advanced Materials, 3(1991) No. 7/8 pp. 397–399.

Zuberek et al:, "Magnetostriction Constant of Multilayer Ni–Ag Films Determined by Ferromagnetic Resonance" Journal de Physique, No. 12 vol. 49, Dec. 1988, pp. 1761–1762.

Dirne, et al: "Soft Magnetic Multilayers: The Role of the Magnetostriction", Journal of Magnetism and Magnetic Materials 83 (1990) 399–401.

|    | t(Fe) (nm) | t(Co) (nm) | t(Ag) (nm) |               | $T_a$   | $t_a$      |
|----|------------|------------|------------|---------------|---------|------------|
| S1 | n          |            | n          | n = 1,2,3,4,5 |         |            |
| S2 | n          | 2n         | 5          | n = 1,2,5,10  | 290°C   | 30mins     |
| S3 | n          | 2n         | 5          | n = 1,1.5,2,3 | 300°C   | 10-50mins  |
| S4 | n          | 2n         | 2          | n = 1,1.5,2,3 | 300°C   | 10-50mins  |

Fig. 10

MAGNETOSTRICTIVE MATERIAL

This is a continuation of application Ser. No. 08/244,755, filed on Jun. 9, 1994, which was abandoned upon the filing hereof.

This application claims benefit from International No. PCT/GB92/02275 filed Dec. 9, 1992, which claims priority from British Patent Application 9126207.1 filed Dec. 10, 1991.

BACKGROUND OF THE INVENTION

This invention relates to the production of materials with useful magnetostrictive properties.

Magnetostriction is the property which relates magnetic characteristics of a body of material to a change of the shape of the material. The property is seen in the change in size of bodies of certain materials when the magnetic environment changes or the change in magnetic characteristic when a force is applied to such a body to change its shape. Magnetostriction is a dimensionless quantity represented by the magnetostriction constant $\lambda_S$, relating magnetization and shape change and in the SI system of units useful values are some tens or hundreds of parts per million, particularly for use in sensors and transducers. For such uses a high magnetomechanical coupling factor is desirable. Also "soft" magnetic properties are generally preferred.

While thin film amorphous alloys and magnetic multilayers individually provide some of the required properties there is still a strong need for a significant improvement in the properties available and for materials which exhibit a useful combination of such properties.

SUMMARY OF THE INVENTION

It is an object of the invention to provide materials with improved properties and methods of production of such materials.

According to the invention there is provided a magnetic material of at least two component parts arranged to have respective structures which mutually are not homogenous, the structure of one part cooperating with the structure of the other to assist the magnetostrictive behaviour of the material.

The cooperation may be a pseudo free surface on at least one of the two component parts.

The cooperation may reduce restriction of the local moment of at least one of the two component parts.

The cooperation may be the structure of one part altering the atomic spacing of the other. Preferably the alteration is an increase from the usual spacing. The structure may be the absence of a regular lattice.

There may be an interface region in one component where the first and second components are contiguous. There may be an interface region where the layers are contiguous. The modification may be in the interface region. Where the interface region is in an elemental component the lattice structure may be one other than the usual one for the elemental component. Where the interface region is in a component which is at least partly an alloy the alloy may have a ratio other than the usual one for the alloy.

A third component layer may be overlaid on the second and a lattice structure of the third layer may be modified in its turn. Further component layers may be overlaid with or without lattice structure modification.

A layer may have a lattice structure modified by an overlaid layer, at least contiguous to the overlaid layer.

Each of the component layers may have an inherent lattice structure and a modification may be that at least one inherent structure is modified by another contiguous inherent structure.

The modification may be that the second lattice, at least where it is contiguous to the first component layer, adopts at least approximately the first lattice form.

One of the first and second component layers may be a magnetic component and the other may be magnetic or a non-magnetic component. While each of the first and second layers will generally be different elements or alloys it is also possible that magnetic and non-magnetic forms of one component may be used.

The magnetic component may be chosen from the group of ferromagnetic elements of at least iron, nickel, cobalt, gadolinium and terbium.

The non-magnetic component may be chosen from aluminium, magnesium, gold and silver, silicon oxide.

Preferably there are many first and second layers in the material forming a multilayer material. Generally the first and second layers are alternated. One first layer and the overlaid second layer may be identified as a bilayer. A first and second layer may have a third layer associated therewith as a trilayer and may further have a fourth layer associated therewith as a quadlayer. In general the material form can be expressed as having M multilayers each having N component layers. Typically N will be between two and five while M will have a value of a few tens, typically 20 to 50.

There may be a substrate on which the multilayer material is built up. The material may remain on the substrate for use or be released therefrom, for example by chemical means. The substrate may be glass or mica or KAPTON (RTM) or other suitable material. The magnetic material may be prepared in the place of eventual use, for example by deposition of successive component layers on a machine part or like object. There may be more than 30 bilayers.

Each layer of a bilayer may be at least a few nanometers thick, that is a few tens of atoms thick, and may be up to ten or more nanometers thick. It is believed that a well-defined boundary is useful where the second layer is overlaid on the first. This will produce a stress-free strain in the overlaid layer.

One form of the material described above may be prepared by a method including overlaying the second component on the first, providing a well-defined boundary where the second component is contiguous with the first, and causing or producing a stress-free strain in the overlaid component, at least adjacent to the first component.

Another form of the material described above may be prepared by a method including overlaying the second component on the first, and permitting or causing the second component structure to be influenced by the first to produce the cooperation.

According to a particular aspect of the invention there is provided a magnetic material of a first component layer and a second component layer overlaid on the first, there being a lattice structure in at least one of the layers and in which magnetic material at least one lattice structure is modified where the first and second component layers are contiguous whereby the magnetostrictive property of the material is enhanced.

There may be an interface region where the layers are contiguous. The modification may be in the interface region. Where the interface region is in an elemental layer the lattice structure in at least the interface region may be one other than the usual one for the layer element.

According to the invention there is provided a method of producing a multilayer magnetic material including depositing a first component, causing or permitting a second component to be progressively overlaid on the first, controlling the deposition of the first component and the overlaying of the second component to produce respective different structures, and causing or permitting the structures to cooperate to assist the magnetostrictive behaviour of the material.

The method may include providing a first component layer of a first lattice structure, causing or permitting a second component layer of a second lattice structure to be progessively overlaid on the first, and controlling the overlaying of the second component so that at least one component layer in a region contiguous to the interface of the layers has a lattice structure modified by the overlaying action.

The method may include overlaying by sputtering. The method may include overlaying substantially atom-by-atom. The method may Include sputtering from a target which may be of one element or of two or more elements to enable the deposition of an alloy.

The method may include causing or permitting the respective different structures to be distinct and form an interface which provides a pseudo free surface.

A multilayer material as described above has an M/H loop characteristic which is altered by distorting the material, for example by bending.

According to a particular aspect of the invention there is provided a multilayer magnetic material as described above in which the overlaid second layer is covered by an insulating layer, to enhance the frequency response.

According to the invention there is provided a magnetic material arrangement including a magnetic material as described above and means to cooperate with the material to convey to an external connection a response of the material to an external action.

The response may be a change of permeability or dimension and the external action may be the stressing of the material. The action may be flexure of a support for the material or an ambient pressure change, or an external magnetic field.

The arrangement may form part of an accelerometer, a torque sensor or like device.

BRIEF DESCRIPTION OF THE DRAWINGS

Embodiments of the invention will now be described with reference to the following examples and drawings, in which:

FIG. 6 shows magnetostriction constant of Fe/Ag multilayers (S1) versus 1/(modulation period), FIG. 7 shows magnetostriction constant of Fe—Co/Ag multilayers versus 1/(modulation period) calculated using $E_f$ from both the volume average and the vibrating reed correction from equation 5, (squares and circles respectively). Also shown are the effective magnetostriction constants of the alloy layers alone, using the volume average $E_f$ method (triangles), FIG. 8 shows magnetostriction constant of Fe—Co/Ag multilayers versus 1/(modulation period), a) $t_{Ag}=2$ nm (S4), b) $t_{Ag}=5$ nm (S3), c) $t_{Ag}=5$ nm, $t_{anneal}=30$ minutes (S2), FIG. 9 shows magnetostriction constant of Fe—Co layers within Fe—Co/Ag multilayers versus 1/(modulation period), (a), (b) and (c) as in FIG. 8, and FIG. 10 is a table of materials exemplifying the invention.

DESCRIPTION OF PREFERRED EMBODIMENTS

Figure 1:
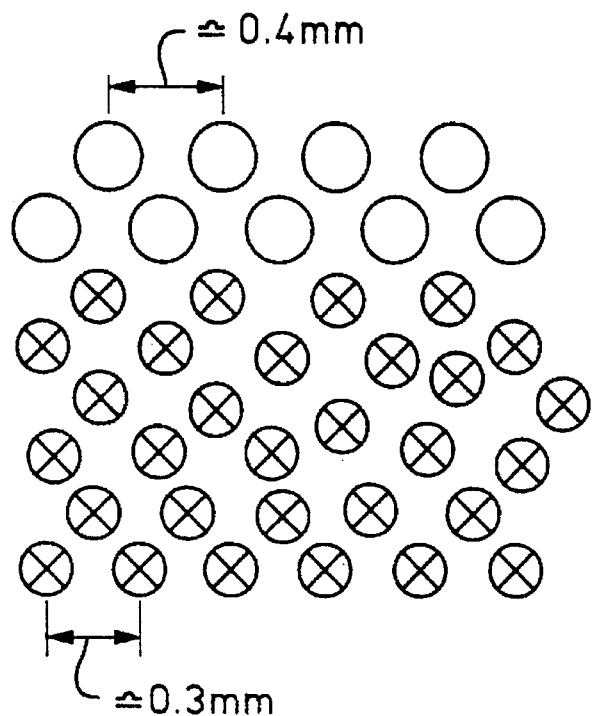
FIG. 1 shows in schematic form a representation of a lattice structure of a multilayer material according to the invention.

Various proposals for multilayer materials having magnetic properties have been made, for example de Wit, Witmer and Dirne (Advanced Materials, Vol. 3 (1991) No. 7/8 pp 356 to 360) and Zeper, van Kesteren and Carcia (Advanced Materials, Vol. 3 (1991) No. 7/8 pp 397–399). In the first of these (de Wit, etc) a material with enhanced saturation magnetization and relative permeability but minimal magnetostriction, specifically for a video recorder read/write head, is described. To achieve this a very small grain size is sought for the magnetic material layer (iron, grain size below 10 nanometers) and to produce such a grain size the iron layers are around 10 nanometers thick. The layers are separated by thinner layers of another ferromagnetic material, specifically an iron/chromium/boron layer. This layer needs to be at least two nanometers thick to prevent the grains in one iron layer from linking with those in another iron layer by columnar growth and specifically epitaxial growth is not desired. In the second (Zeper et al) a magneto optical recording material is described, for enhanced recording density, which has adequate Kerr rotation and low enough Curie temperature while having a preferred magnetization direction perpendicular to the material layer. This preferred direction only occurs with cobalt/platinum or cobalt/palladium multilayers when the cobalt layers are less than some 0.8 to 1.2 nanometers. The thickness of the non-magnetic but magnetically polarisable platinum or palladium layer is set by the required balance of Kerr effect and Curie temperature and for platinum is about 0.9 nanometers with a 0.4 nanometer cobalt layer. The cobalt layer is about two atom layers thick so that the required magnetic anisotropy is not reduced by "bulk" atoms between the surface layers. In Zuberek, Szymczak, Krishnan and Tessier (Journal de Physique, Vol. 12, No. 9, Colloque C8, December 1988, pp 1761 to 1762) it is suggested that a "bilayer" of evaporated component materials depends for effectiveness on the thinness of a nickel layer. In Dirne, Tolboom, de Wit and Witmer (J. Magn. Magn. Mat., No. 83, (1990) pp 399 to 400) the possibility of interface mixing in Fe/Co multilayers is discussed and seen as a disadvantage.

Techniques to avoid this disadvantage are suggested.

Multilayers of the present invention do not follow the techniques of the above proposals. The present invention provides in one aspect that a layer of a first component overlaid on another layer, of a second component, is caused in a region contiguous with the other layer to adopt a structure other than that of the lattice which it would normally adopt. In this way, which can be described as lattice mismatch, a stress-free strain can be produced in at least the contiguous region of the overlaid layer. A result of this stress-free strain is an enhanced magnetostriction constant, $\lambda_s$.

Typically such layers of a first material overlaid on the second would be arranged as several bilayers on a substrate. Each layer of a bilayer would be some five to fifteen nanometers thick and can be between at least one nanometer thick and ten nanometers thick. The layers are deposited by sputtering so that atoms being deposited arrive at a rate slow enough to be able to be influenced in deposited position by the existing lattice of the second component layer or that of the first-deposited overlaid first component atoms. Care is needed to avoid building stress into the layers by the thermal effects of sputtering. Some ten to fifty bilayers can be deposited. The overlaid component applied adjacent to the second component lattice is conveniently caused to adopt a lattice spacing appropriate to that of the second component. This will cause a stress-free strain in at least the contiguous region of the overlaid component. The stress-free strain will be best exhibited if there is a sharp boundary between the layers.

If required a pre-stress can be built in to the eventual material by, for example, keeping the substrate hot during deposition of components so that the substrate contracts on cooling. Also a magnetic bias can be built in by including a layer of a permanently magnetizable component for example as or immediately above the substrate. A buffer substrate can also be used but care must be taken that the buffer transmits any strain that is applied for action by or on the magnetostrictive material. An inert or insulating layer may be applied to protect the material. Films may be grown under the influence of an imposed magnetic field to enhance the desired effect.

FIG. 1 represents in a schematic manner the lattice at and near the surface of the second component layer and the lattice in the contiguous region of the overlaid component layer. In the Figure overlaid component atoms are indicated by the smaller, crossed, circles and the second layer component atoms by the more widely spaced larger, open, circles.

To investigate the magnetostrictive properties further examples have been prepared. Typically these are a number of alternate layers of magnesium and iron, each a few nanometers thick and having a few tens of bilayers. The layers are not necessarily of the same thickness. The layers are deposited by sputtering from alternately exposed sources using conventional techniques. The preparation is arranged to ensure that bulk effects are not significant. The effect of stress on the film on the shape of the magnetization/field (M/H) loop was also examined. A small amount of distortion, by bending the specimens, changed the loop shape by a detectable amount, increasing the value of M at lower values of H compared with the loop for the unstressed specimens.

Figure 2:
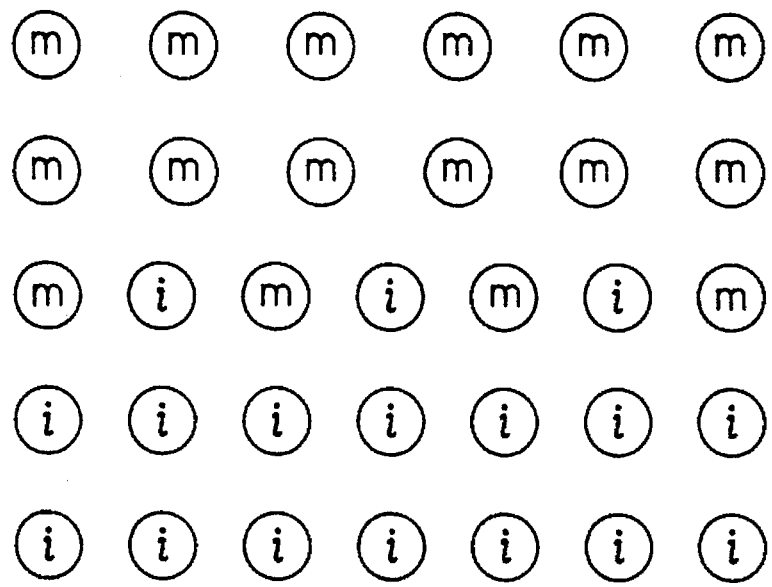
FIG. 2 shows in schematic form a representation of another lattice structure of a multilayer material according to the invention.

Other structures may be used to achieve the invention. Certain combinations of overlaid component layers will produce a degree of alloying and this in turn can produce "dislocations" in an atomic level structure which would otherwise be adopted. Provided one component layer is magnetic the other can be an insulator as the merging of the layers where they are contiguous can alter the spacing of the magnetic component layer lattice and thus usefully alter the magnetostrictive property. FIG. 2 shows in sketch form this action where atoms of a magnetic component, identified at m, are displaced by the presence of atoms of another component, which may be non-magnetic or even an insulator, identified at m.

The overlaid component layers are formed of different elements, different alloys, a magnetic and a non-magnetic form of the same element, or a magnetic and non-magnetic form of the same alloy.

The present invention provides in another aspect an interface effect which can be a relatively sharp lattice mismatch so that the overlaid components cannot easily mix or in a yet further aspect a smoother mismatch which may be an intermetallic region as overlaid components merge. Component layers need not be deposited separately, the rate of a first layer may be reduced while the rate of a second layer is increased to take over.

An insulating layer, for example silicon oxide, can be introduced to produce an improvement in performance, especially an improved high frequency performance. The insulating layer thickness will be dependent on the frequency at which the device is to operate but will also be dependent on the effect of the relative thickness of the insulating layer and the bilayer on the propagation velocities in the insulating and magnetic components. From these considerations it is possible to derive suitable thickness relationships for a particular application of the multilayer material. In general the insulating layer thickness will be several times that of the individual magnetic component layer. In this way magnetostrictive materials with several tri- or quad- layers can be built up, of the general form of L multilayers each having N component layers. At least one of the N component layers will be a magnetic, generally a ferromagnetic, substance such as iron, nickel, cobalt, gadolinium or terbium while another will be a non-magnetic substance and may be a metal or an insulator, examples including aluminium, magnesium, gold, silver and silicon oxide. If N is more than two one of the non-magnetic layers can be a metal and another an insulator. A further magnetic component layer may be included. A magneto-electric transducer can be formed by placing structures as exemplified above onto an electrostrictive structure such as PVDF, the dimensional changes in the magnetic structures imposing a strain on the electrostrictive structure, producing an electrical signal related to the action on the magneto strictive structure.

Further examples of the invention will now be described.

Multilayers are grown using an rf glow discharge sputtering system in a sputter-up configuration with three 15 cm water-cooled magnetron target electrodes on a carousel, and a water-cooled substrate platen electrode which allows the substrate to be pre-sputtered. The substrate platen also has a heater capable of temperatures up to 600° C. The target-substrate distance was set at 60 mm, with an argon plasma pressure of 5 mtorr. The sputtering equipment is a NOR-DIKO machine. The deposition rates were calibrated using a "Talystep" stylus based film thickness measurement instrument. Structural characterization was also done using X-ray diffraction.

The substrates were glass and Kapton (Registered Trade Mark) (polyimide). The substrate for SAMR measurements (see below) was 25 mm thick Kapton, which was thin enough and had a low enough Young's modulus to avoid overly constraining the films while still being able to support them.

Fe/Ag multilayers were grown with 50 repeats (i.e. 50 bilayers).

Figure 4:
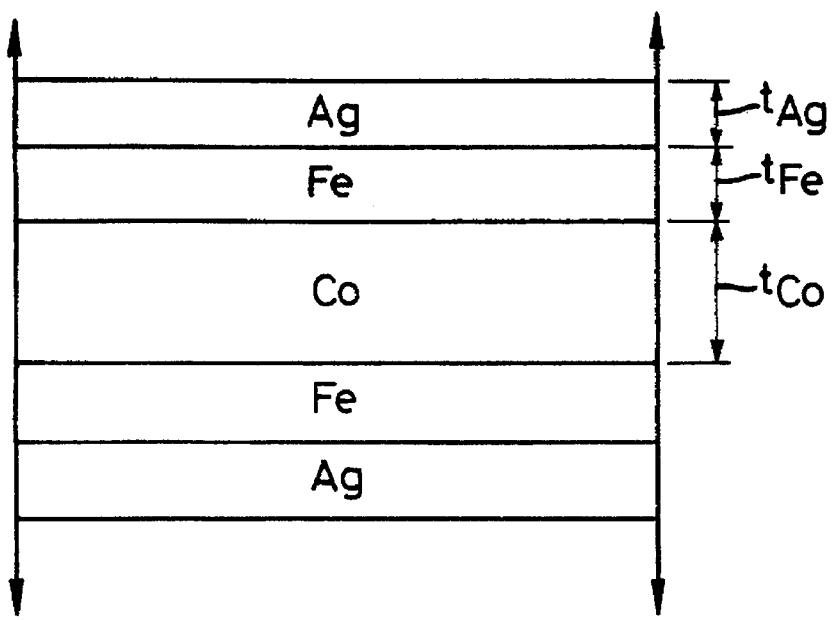
FIGS. 4 and 5 show in schematic form a portion of a multilayer material, after deposition and after subsequent annealing respectively.
Figure 5:
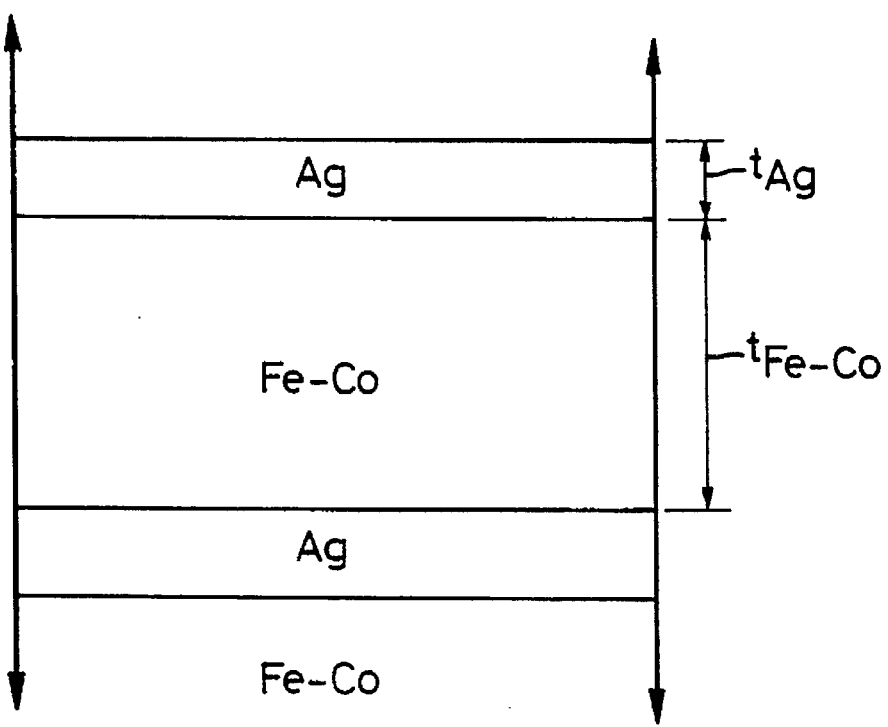

Fe—Co/Ag multilayers of 25 repeats (25 bilayers) were grown. The layers of Fe—Co alloy in the Fe—Co/Ag multilayers were produced by growing sandwiches of Fe/Co/Fe between the silver layers (FIG. 4). The multilayer was subsequently annealed to allow interdiffusion of the Fe and Co to form a layer of alloy of thickness $t(Co)+2t(Fe)$ (the Ag is immiscible with both) (FIG. 5). The heat treatment was done in a non-inductively wound tube furnace, with the sample laid flat between two glass slides in a vacuum provided by a rotary pump and nitrogen trap to eliminate oxidation. The anneal time and temperature were 30 minutes and 290° C. respectively.

A series (S1) of five Fe/Ag multilayers were grown where t(Fe)=t(Ag)=1,2,3,4,5 nm.

A series (S2) of Fe/Co/Fe/Ag (i.e. Fe—Co/Ag) multilayers were grown where the thickness of the Co layer was twice that of each of the Fe layers so that the total thickness was the same for both, resulting in a post-anneal alloy of a nominal composition of $Fe_{50}Co_{50}$. The thickness of this layer was varied from 4 to 40 nm and t(Ag) was set at 5 nm. These were subsequently annealed in vacuum for 30 minutes at 290° C. Two other Fe/Co/Fe/Ag (i.e. Fe—Co/Ag) series were grown with silver layer thicknesses of 2 (S4) and 5 (S3) nm. The anneal times were longer for the films with thicker Fe/Co layers because of the greater degree of interdiffusion required. The anneal times (at 300° C.) were 10, 20, 30 and 50 minutes for alloy layer thicknesses 4, 6, 8, 12 nm respectively.

As the layer thicknesses are decreased the volume fraction of the interface regions is increased. This increases the proportion of the multilayer material which is formed by atoms at or near the surface of a layer. The local moment is increased in the vicinity of a free surface so the local moment effect is enhanced as the interface volume fraction is increased. The texture of a layer is also significant and its retention can be enhanced by depositing the alloy directly and avoiding or reducing the annealing step. This will also encourage growth of the alloy in the [110] direction normal to the layer.

The coercive fields of Fe—Co/Ag multilayers are between 1 and 2 $kAm^{-1}$, reducing with layer thickness. Generally, the annealing rendered the multilayers magnetically softer. Also by annealing the multilayers were stress-relieved and the iron and cobalt layers were caused to mix more thoroughly. The interfaces with silver were probably sharpened, since silver is immiscible with iron and with cobalt. For the thinnest iron and cobalt layers (D=9nm, i.e. $t_{Co}$=2nm) the region between silver layers would have been almost completely alloyed as-deposited [Dirne and Denissen, 1989]. Annealing this multilayer increased (approximately doubling) its coercive field in distinction to the other multilayers, and it became impossible to measure the magnetostriction. This is considered below.

The length of an anneal required to achieve complete alloying at a given temperature will depend on the thickness of the component layers. Thus it is possible that the anneals did not completely alloy the layers, especially in the thicker multilayers, and that they were longer than required for the thinner multilayers. The optimum heat treatment may not have been used.

Magnetostriction measurements were made using the Small Angle Magnetization method proposed by Norita et al. [1980] and widely used on amorphous ribbons.

The basic principle of the method is as follows: the sample to be measured is saturated in the longitudinal direction (z) by a large dc field. A smaller ac field of frequency ω acts in the transverse direction (y). This results in a small degree of rotation of the macroscopic moment direction about the longitudinal direction. If a stress, σ, is also applied to the sample along this direction, the angle of moment rotation Is given by $$\Theta = \frac{\mu_o M_s H_y}{H_z + H_d + H_\sigma} \quad (1)$$

where $H_d$ is the demagnetizing field due to the sample shape, and $H_\sigma$ is the stress-induced anisotropy field. This is given by $$H_\sigma = \frac{3\lambda_s \sigma}{\mu_o M_s} \quad (2)$$

The sample is mounted within a search coil whose axis is in the longitudinal direction. Thus a rotation of the magnetization about this axis results in an induced ac voltage across the search coil with frequency $2\omega$, $V_{2\omega}$.

A change in the stress on a magnetostrictive material effects a change in the stress induced anisotropy field. In the case of a positively magnetostrictive material, a tensile stress tends to make the stress axis magnetically easier, so as to aligning the moments towards this axis. This would cause the angle of moment rotation to decrease, so as to decrease the search coil output voltage.

This change in output voltage can be compensated by adjustment of the dc field, $H_z$. The change in $H_z$ is then equal to the change in $H_\sigma$. Thus, the magnetostriction constant, $\lambda_s$, is generally determined by plotting the change in $H_z$ for a series of applied stresses, so that (where moment rotation is small)

$$\lambda_s = \frac{\mu_o M_s dH_z}{3 \, d\sigma_a} \quad |V_{2\omega}, H_y. \quad (3)$$

The multilayers are too thin to be self supporting and need to be measured while still on their substrates. Although these can have elastic moduli far lower than the multilayers, they are much thicker and so accommodate a significant proportion of the stress, so it is necessary to correct for their presence.

This correction can be made by assuming that the multilayer is strongly adhered to the substrate so that they strain by the same amount and so that the Young's modulus, E, of the whole is equal to the volume average of the component layers and the substrate. This assumes that the reed as a whole (i.e. substrate +multilayer) is effectively homogeneous. In this case the magnetostriction is given by $$\lambda_s = \frac{\mu_o M_s}{3} \left[ \frac{E_\omega A_{f+s}}{E_f} \right] \frac{dH_z}{d\sigma_a} \quad |V_{2\omega}, H_y. \quad (4)$$

The same method of correction was also used by Wenda et al. [1987] on measurements of FeB and FeSiB single films sputtered onto polyester substrates.

Measurements of multilayer samples were taken on two slightly different SAMR apparatus arrangements. The dc field was applied using a solenoid, while the ac field was applied with a pair of Helmholtz coils. The sample was placed within a search coil (4000 turns) coaxially with the solenoid, in the center of the Helmholtz coils. In the second configuration, a second, "bucking", coil was also present and was backed off against the search coil to cancel out any induced voltages common to both, i.e. due to sources other than the sample magnetization.

The sample was clamped at both ends. The clamp at one end was fixed while that at the opposite end was connected to a cable which was loaded with known weights. The dc field was determined from the product of the current and the number of turns per unit length in the solenoid.

The values of $B_S$ were obtained from literature, namely 2.0 T for iron and 2.3 T for $Fe_{50}Co_{50}$ alloy. The value of $B_S$ for the whole multilayer was simply $B_S$ for the relevant magnetic layer multiplied by its volume fraction.

The Young's modulus of the multilayers was measured using the vibrating reed method, which is fully described in Berry and Pritchet [1975]. It is based on the measurement of the resonant frequencies of various modes of cantilever vibration, $f_n$, of reeds clamped at one end.

Reeds were cut from the multilayer using a sharp blade and had free lengths and widths of approximately 13–20 mm and 1 mm respectively.

The value of E for the multilayer can be obtained from the value for the reed from the expression (from Berry and Pritchet):

$$\frac{f_{reed}}{f_{substrate}} = 1 + \frac{t}{d}\left[\frac{3E_f}{E_s} - \frac{\rho_f}{\rho_s}\right], \quad (5)$$

where the subscripts f and s refer to the multilayer and substrate respectively, and t and d are the multilayer and reed thicknesses (t<<d).

The value of $\lambda_S$ for the multilayer was calculated from equation 4. In the case of the Fe—Co/Ag multilayers (t(Co) =2t(Fe)), two data sets are presented, corresponding to the two methods of calculating $E_f$. For the Fe/Ag data, only the values of $\lambda_S$ derived from the assumption of a volume average $E_f$ are shown.

Figure 6:
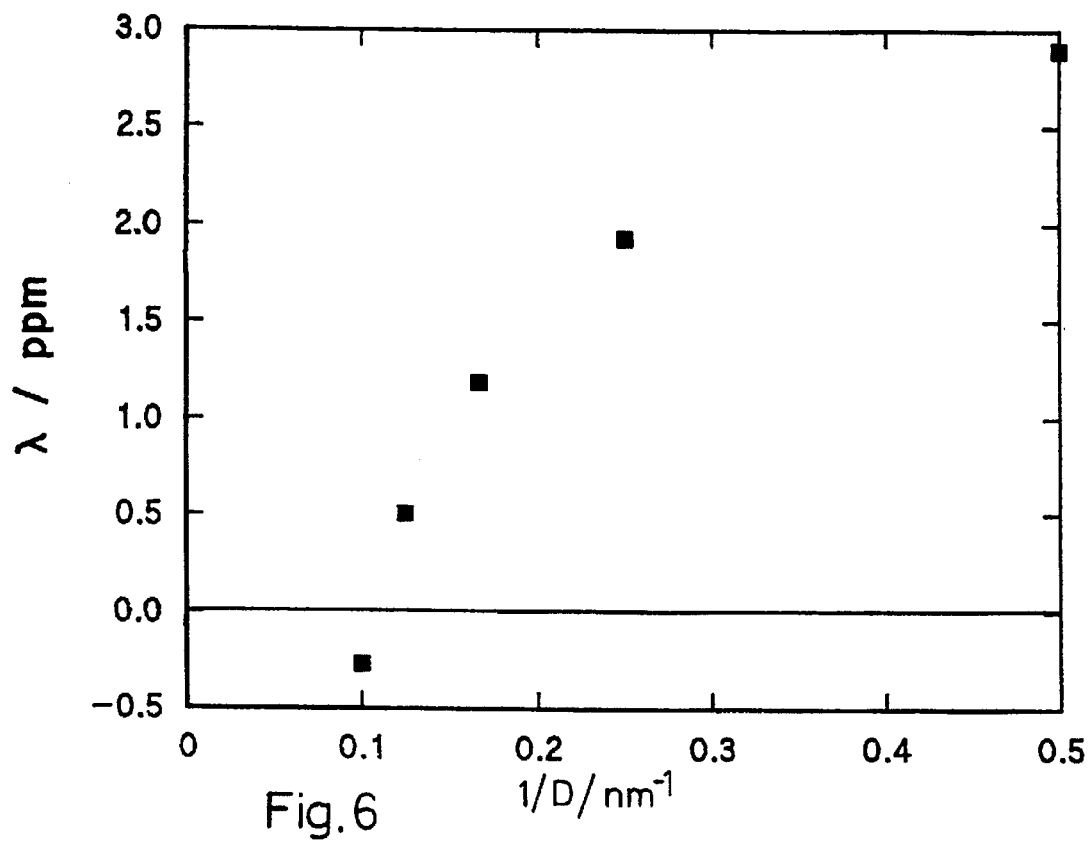
FIGS. 6 to 9 show plots of characteristics of materials embodying the invention.

The data for $\lambda_S$ is shown versus the reciprocal of the modulation period, D, in FIG. 6. At 1/D=0 the value of $\lambda_S$ should be that for bulk iron. The bulk value of $\lambda_S$ of polycrystalline iron is −7 ppm, although this becomes more positive as it becomes more textured, so that perfectly textured polycrystalline iron with the [110] direction normal to the film surface has a value of $\lambda_S$ of approximately 14 ppm. In practice, the measured value of $\lambda_S$ for a single iron film will generally lie between these two values. As a check a thick (0.8 μm) iron film was deposited onto each side of a Kapton susbtrate (1.6 μm total). $\lambda_S$ was measured to be −3.0 ppm.

As D decreases so that the volume fraction of the Fe/Ag interface layers increases, it is found that $\lambda_S$ becomes more positive. Hence the presence of silver is seen to enhance the value of $\lambda_S$ in iron, as expected.

A series of multilayers were grown with layers of Fe and Co of equal thickness (5 nm) with silver layers of varying thickness. Because there was approximately twice the amount of iron as cobalt in the alloy layer after annealing, it is probable that there was a composition gradient across the layer, with a corresponding variation in $\lambda_S$. The $\lambda_S$ data from this series of multilayers did not show any systematic trend and there was a wide scatter in the data and is therefore not shown here.

Figure 7:
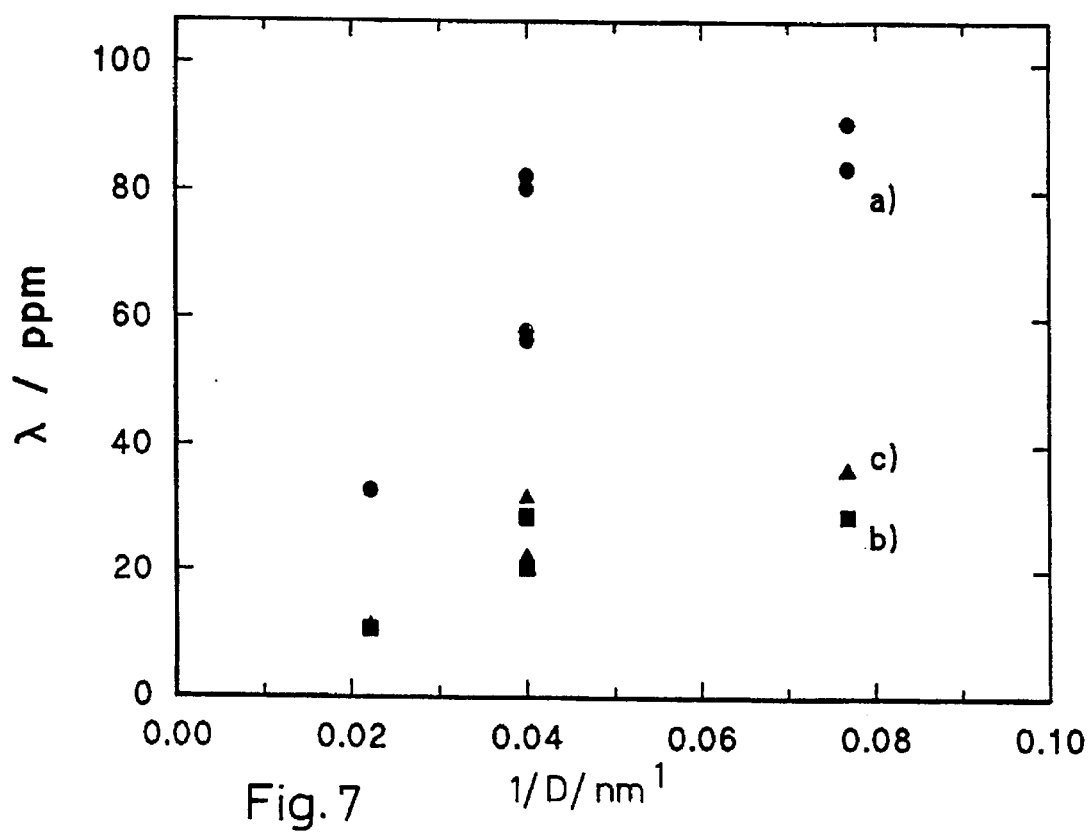

The $\lambda_S$ data for the second series of multilayers is shown for these films versus the reciprocal of the modulation period in FIG. 7. Also shown is the effective $\lambda_S$ of the magnetostrictive material alone, derived via the data assuming a volume average Young's modulus. There are pairs of data points obtained via the Berry and Pritchet $E_f$ correction method for most samples, corresponding to two values of $E_f$ obtained from the third and fourth modes of reed vibration. There are two samples measured with t(alloy)=30 nm since two sections were taken from the same substrate and were annealed independently. However, $E_{reed}$ for this sample was only measured using a reed from one of the anneals, so the pair of points from this sample with the higher $\lambda_S$ values may be subject to large error. This figure illustrates the difference in the data resulting from the two methods of correction of the Young's modulus.

Before anneal, most samples were found to have small negative magnetostriction (generally smaller than −5 ppm), and large positive $\lambda_S$ after anneal confirming that alloying of the component TM layers had alloyed. The sample with t(alloy)=4 nm gave a large positive $\lambda_S$ before annealing, indicating that the iron and cobalt layers had intermixed to a high degree. It is suggested in Dirne and Denissen [1989] that Fe—Co alloys form at interfaces during deposition, with thicknesses of approximately 1 nm This means that approximately 50% of the Fe—Co in this sample was intermixed before annealing. Unfortunately, no SAMR response could be obtained from the sample after anneal. As stated earlier, this was accompanied by a remarkable increase in coercive field. It may be that since the layers were so thin, the anneal caused disruption of the coherency of the multilayer.

From the volume average data, it is seen that $\lambda_S$ of the multilayer increases to approximately 20 ppm as the alloy thickness is reduced to 8 nm, equivalent to a value of $\lambda_S$ of about 36 ppm for the alloy layers.

Figure 8:
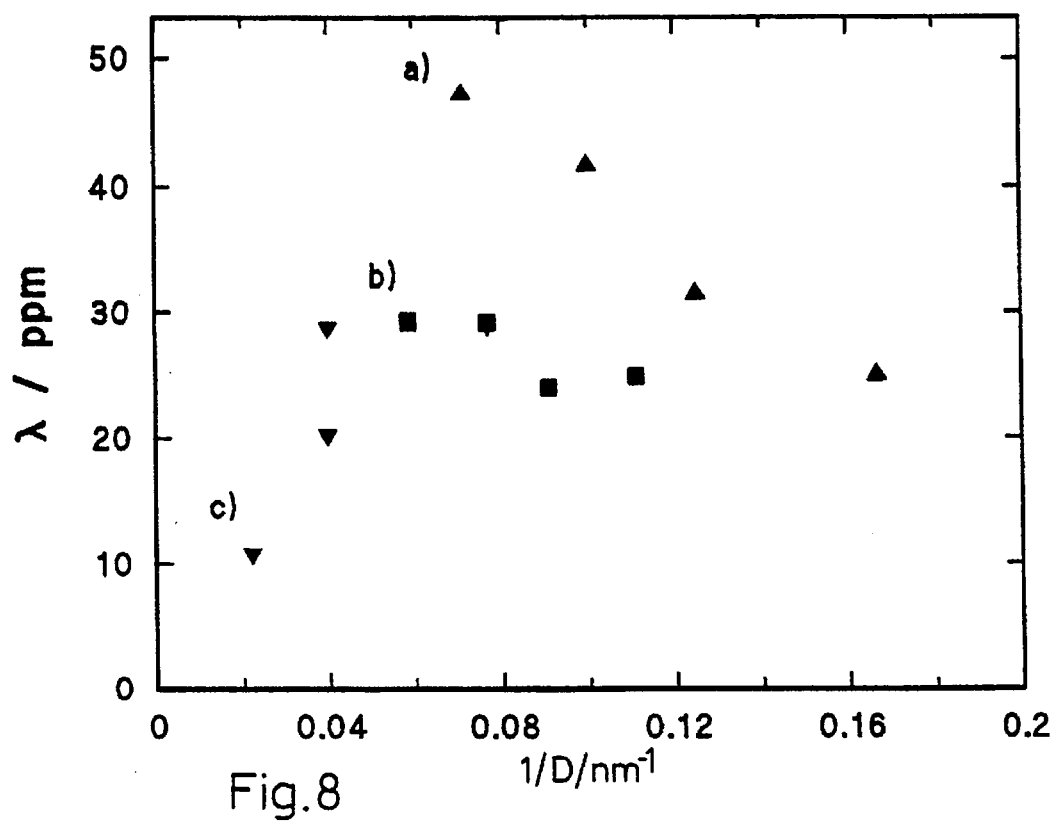
Figure 9:
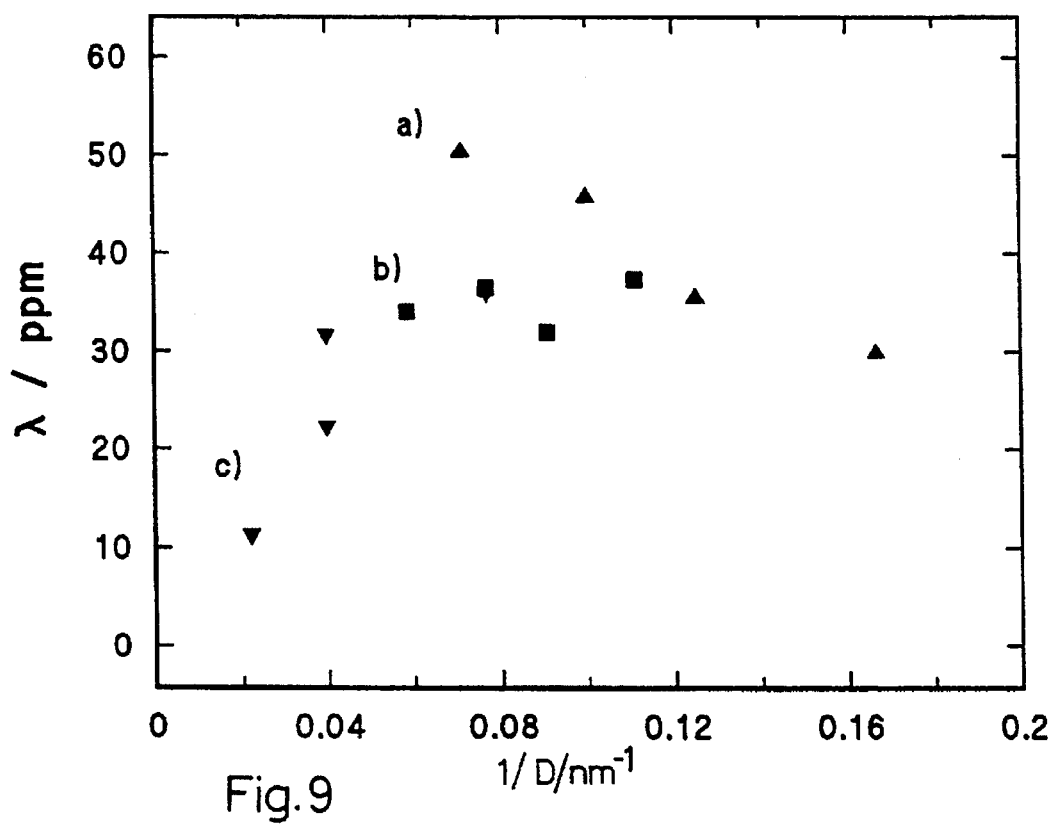

The magnetostriction of all three series (S2, S3, S4) of the Fe—Co/Ag multilayers were measured and are shown in FIG. 8. These values were calculated using the volume average Young's moduli. The corresponding values of $\lambda_S$ for the alloy alone are shown In FIG. 9. A clear trend is seen for the series of multilayers (S4) with $t_{Ag}$=2 nm, where $\lambda_S$ decreases with decreasing alloy layer thickness. The data for the series of multilayers with $t_{Ag}$=5 nm also show some reduction of $\lambda_S$ with $t_{Fe-Co}$, but in FIG. 8, the values of $\lambda_S$ for the alloys are approximately constant (within error), indicating that the reduction in $\lambda_S$ for the multilayer is due to loading by the silver layers. The reduction in $\lambda_S$ for the $t_{Ag}$ data set cannot be accounted for in this way.

The decrease of $\lambda_S$ of the thicker multilayers from the series (S2) is thought to be due to the iron and cobalt layers not fully intermixing during the half-hour anneal. It should be noted that the values of $\lambda_S$ for the two multilayers comprising layers of 2 nm Fe, 4 nm Co and 5 nm Ag, annealed at approximately 300° C. for 30 minutes were measured to be the same within error. This adds confidence to the repeatability and accuracy of the data. If intermixing is poor, composition gradients can arise.

The value of $\lambda_S$ of the alloy layer was measured to be approximately 35±3 ppm. This compares with approximately 80 ppm for the bulk. A multilayer of Fe/Co was deposited without silver layers, and was annealed nominally to form a single layer (0.5 μm total thickness) of Fe—Co alloy, $T_a$=300° C., $t_a$=30 minutes. The value of $\lambda_S$ of the film was measured to be 43 ppm. A further heat treatment of 30 minutes at 300° C. was found to cause an increase in $\lambda_S$ to approximately 65 ppm.

The magnetostriction constant obtained from SAMR values depends on the Young's modulus of the reed and also on that of the film only. Discrepancies have arisen between the values of $E_{film}$ corrected from $E_{reed}$ from two different methods of obtaining this correction. The method assuming a volume average of the moduli is thought to be the more reliable.

The values of $\lambda_S$ of the Fe/Co/Fe/Ag multilayers were small and negative, as would be expected from an average of Fe and Co. After annealing, the $\lambda_S$ values were large and positive, indicating that the Fe and Co had alloyed to a large extent. Annealing also had the effect of making the films softer, predominantly due to relief of Internal stresses. Values of $H_C$ of the post-anneal samples were typically of the order of 1 kA/m.

Figure 3:
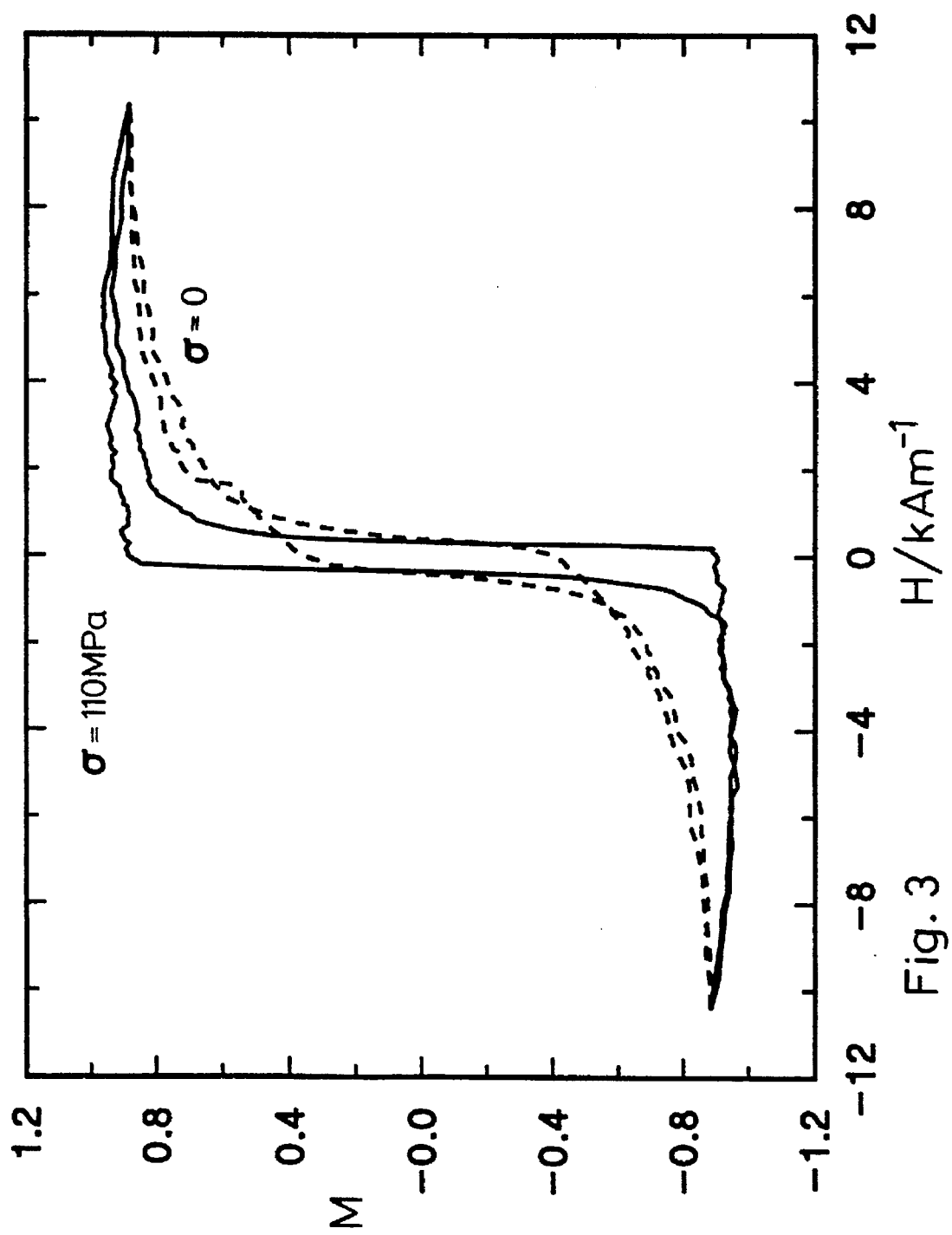
FIG. 3 shows M/H characteristics of a material according to the invention.

FIG. 3 shows the effect of stress on the M/H loop for one of the multilayers from series S4. The specific one used is that where n=3. The multilayer had 25 bilayers, each deposited as 3 nm Fe/6 nm Co/3 nm Fe/2 nm Ag, supported on a 25 micrometer Kapton layer. Annealing was 50 minutes at 300° C. under vacuum. The dotted line is the M/H characteristic at stress σ=0. When a stress of 110 MPa is applied the shape and size of the M/H loop changes very significantly, as shown by the solid line. M is in arbitrary units.

In the case of the Fe/Ag multilayers, reduction in the thickness of the layers (i.e. an increase in the volume fraction of the interface regions) has the effect of making the magnetostriction more positive. The measured values of $\lambda_S$ in this study increased from approximately −0.3 ppm for 5 nm Fe/5 nm Ag to approximately +3 ppm for 1 nm Fe/1 nm Ag. This is consistent with an increase in the local magnetic moment of iron at the Fe—Ag interfaces.

In the case of the Fe—Co multilayers, $\lambda_S$ was seen to decrease with decreasing modulation period, where this was shown to be due to mechanical loading by the silver layers, where $t_{Ag}$=5 nm. When this correction was made, the value of $\lambda_{Fe-Co}$ were found to be approximately 35 ppm, which is considerably lower than those of bulk Fe—Co alloys. Non-optimal heat treatments are thought to contribute to the reduction in the values, as indicated by the decrease in $\lambda_S$ for the thicker multilayers annealed for 30 minutes. A definite decrease in $\lambda_S$ with decreasing alloy layer thickness was seen for the multilayers where $t_{Ag}$=2 nm, which cannot be accounted for by the loading by the silver layers. The reason for this is not clear. It is possible that the silver layers are so thin that the alloy layers have percolated through, especially where these are appreciably thicker than the silver, so that the parameters of the multilayer approach those of a bulk material. It may be that inclusion of silver in the multilayer causes a reduction in $\lambda_{Fe-Co}$.

It is seen from the above that thickness and crystallographic texturing of the alloy layer and silver layer loading all can affect the value of $\lambda_S$. Those skilled in the art will be able to proceed on the basis of the techniques set out above to produce multilayers with significant values of $\lambda_S$ using appropriate component layers and dimensions.

Some of the above examples show that the technique of causing a magnetic component layer to adopt, in a surface region at least, a lattice structure other than the one it would normally adopt produces a magnetic material which exhibits a non-zero magnetostrictive coefficient, albeit at a coercivity more appropriate to a "hard" magnetic material than a "soft" one, but noting that this parameter was not controlled.

Others of the above examples show that the technique of causing a sharp lattice mismatch or smoother mismatch intermetallic region in overlaid component layers produces a magnetic material which exhibits a non-zero magnetostrictive coefficient. In particular a sharp lattice mismatch, such as occurs with immiscible component layers, could produce a pseudo free surface. The term pseudo free surface is used to describe the arrangement where the surface of a thin layer can emulate a free surface although another layer is contiguous.

The magnetic material can be used in sensing devices, such as pressure gauges, accelerometers and torque sensors, by attaching the material to a structure or by depositing the material in the place where it is to be used.

I claim:

1. A magnetic material comprising:
   a first component layer having a first atomic structure; and
   a second component layer on said first component layer and having a second atomic structure which is non-homogeneous with said first atomic structure of said first component;
   a first surface of said first component layer being contiguous with a first surface of said second component layer;
   a lattice structure of said first component layer at least where said first surface of said first component layer is contiguous with said first surface of said second component layer being modified by said second component layer whereby a magnetostrictive property of said magnetic material is increased.

2. A magnetic material according to claim 1, wherein:
   an atomic spacing of said second component layer is altered by said first atomic structure of said first component layer.

3. A magnetic material according to claim 2, wherein:
   said alteration of said atomic spacing of said second component layer is an increase in an atomic spacing of said second component layer.

4. A magnetic material according to claim 1, wherein:
   at least one of said first atomic structure of said first component layer and said second atomic structure of said second component layer has a modified atomic structure.

5. A magnetic material according to claim 1, wherein:
   said first component layer and said second component layer are contiguous at a first surface of said first component layer and a first surface of said second component layer; and
   a free surface is emulated on at least one of said first surface of said first component layer and said first surface of said second component layer.

6. A magnetic material according to claim 1, wherein:
   said first component layer and said second component layer are contiguous at respective contiguous surfaces;
   whereby a restriction of a local moment otherwise achieved individually by said first component layer and said second component layer is reduced.

7. A magnetic material according to claim 1, further comprising:
   an interface region between said first component layer and said second component layer wherein said first component layer is contiguous with said second component layer.

8. A magnetic material according to claim 7, wherein:
   said interface region comprises an alloy of a first metal forming said first component layer and and a metal forming said second component layer.

9. A magnetic material according to claim 8, wherein:
   said first component layer comprises iron;
   said second component layer comprises cobalt; and
   wherein a usual composition of said alloy is $Fe_{50}Co_{50}$.

10. A magnetic material according to claim 1, wherein:
    at least one of said first component layer and said second component layer is a ferromagnetic material.

11. A magnetic material according to claim 10, wherein:
    said one of said first component layer and said second component layer which is a ferromagnetic material comprises a material selected from a group consisting of iron, nickel, cobalt, gadolinium and terbium.

12. A magnetic material according to claim 10, wherein:
    the other of said one of said first component layer and said second component layer which is a ferromagnetic material is a non-magnetic material selected from a group consisting of aluminum, magnesium, gold, silver and silicon oxide.

13. A magnetic material according to claim 1, wherein:
    said first component layer is different from said second component layer in at least one way selected from a group comprising:

said first component layer and said second component layer are formed of different elements;

said first component layer and said second component layer are formed of different alloys;

said first component layer and said second component layer are formed of a magnetic form and a non-magnetic form of a same element; and said first component layer and said second component layer are formed of a magnetic form and a non-magnetic form of a same alloy.

14. A magnetic material according to claim 1, further comprising:

a plurality of alternating layers of each of said first component layer and said second component layer.

15. A magnetic material according to claim 1, further comprising:

a substrate;

said first component layer and said second component layer being successively deposited on said substrate.

16. A magnetic material according to claim 1, wherein:

each of said first component layer and said second component layer are layers at least one nanometer thick and up to ten nanometers thick.

17. A magnetic material according to claim 1, wherein:

said magnetic material has an M/H loop characteristic which is altered by distortion of said magnetic material.

18. A magnetic material according to claim 17, wherein:

said M/H loop characteristic is altered by bending said magnetic material.

19. A magnetic material according to claim 18, further comprising:

means for conveying a magnetostrictive response of said magnetic material to an external connection.

20. A magnetic material according to claim 1, wherein:

one of said first component layer and said second component layer is an insulating layer, said insulating layer enhancing a frequency response of said magnetic material.

21. A magnetic material according to claim 1, further comprising:

means for conveying a magnetostrictive response of said magnetic material to an external connection.

22. A magnetic material comprising:

a first component layer; and a second component layer overlaid on said first component layer;

at least one of said first component layer and said second component layer having a lattice structure, said lattice structure being modified by the other of said first component layer and said second component layer at least where said first component layer and said second component layer are contiguous, said modified lattice structure increasing a magnetostrictive property of said magnetic material; and at least one of said first component layer and said second component layer being a ferromagnetic material.

23. A method of producing a multilayer magnetic material, comprising the steps of:

depositing a first component layer on a substrate;

progressively overlaying a second component layer on said first component layer; and controlling said deposition of said first component layer and said progressive overlaying of said second component layer to produce respective different atomic structures in each of said first component layer and said second component layer, and a lattice structure of said first component layer being modified by said second component layer at least where said first component layer and said second component layer are contiguous;

whereby a magnetostrictive property of said multilayer magnetic material is increased.

24. A method of producing a multilayer magnetic material according to claim 23, wherein:

said step of progressively overlaying said second component layer comprises a step of progressively sputtering said second component layer on said first component layer.

25. A method of producing a multilayer magnetic material according to claim 23, wherein:

said step of progressively overlaying said second component layer comprises a step of progressively overlaying said second component layer on said first component layer substantially atom-by-atom.

26. A method of using a multilayer magnetic material manufactured by steps of: depositing a first component layer on a substrate, progressively overlaying a second component layer on said first component layer, and controlling said deposition of said first component layer and said progressive overlaying of said second component layer to produce respective different atomic structures in each of said first component layer and said second component layer, and a lattice structure of said first component layer being modified by said second component layer at least where said first component layer and said second component layer are contiguous, whereby a magnetostrictive property of said multilayer magnetic material is increased, said method of using comprising steps of:

applying an external force to said magnetic material; and conveying a response of said multilayer magnetic material due to said force applied to said multilayer magnetic material, to an external connection.

27. A method of using a multilayer magnetic material according to claim 26, wherein:

said conveyed response is a change of permeability of said multilayer magnetic material due to a stressing of said multilayer magnetic material.

28. A method of using a multilayer magnetic material according to claim 27, comprising a further step of:

providing said multilayer magnetic material in an accelerometer.

29. A method of using a multilayer magnetic material according to claim 27, comprising a further step of:

providing said multilayer magnetic material in a torque sensor.

30. A method of using a multilayer magnetic material according to claim 26, wherein:

said conveyed response is a change of dimension of said multilayer magnetic material due to a stressing of said multilayer magnetic material.

31. A method of using a multilayer magnetic material according to claim 26, wherein:

said conveyed response is a flexure of a support for said multilayer magnetic material.

32. A method of using a multilayer magnetic material according to claim 26, wherein:

said conveyed response is a flexure of said multilayer magnetic material due to an ambient pressure change.

33. A method of using a multilayer magnetic material according to claim 26, wherein:

said conveyed response is a flexure of said multilayer magnetic material due to an external magnetic field.

34. A method of producing a multilayer magnetic material, comprising the steps of:

providing a first component layer of a first material having a first lattice structure;

progressively overlaying a second component layer of a second material having a second lattice structure on said first component layer to form a contiguous interface region between said first component layer and said second component layer;

controlling said progressive overlaying of said second component layer so that at least one of said first component layer and said second component layer has said respective first lattice structure and said second lattice structure modified by said step of progressively overlaying in said contiguous interface region between said first component layer and said second component layer to increase a magnetostrictive property of said multilayer magnetic material.

35. A method of producing a multilayer magnetic material according to claim 34, wherein said step of progressively overlaying said second component layer comprises a step of:

progressively sputtering said second component layer on said first component layer.

36. A method of producing a multilayer magnetic material according to claim 34, wherein said step of progressively overlaying said second component layer comprises a step of:

progressively overlaying said second component layer on said first component layer substantially atom-by-atom.

37. A method of preparing a magnetic material comprising the steps of:

providing a first component layer having a first atomic structure;

overlaying a second component layer having a second atomic structure non-homogeneous with said first atomic structure of said first component layer on said first component layer, at least one of said first component layer and said second component layer being a ferromagnetic material, whereby a contiguous boundary is provided between a first surface of said first component layer and a first surface of said second component layer;

a magnetostrictive property of said magnetic material being increased at least where said first surface of said second component layer is contiguous with said first component layer; and producing a stress-free strain in said second component layer, at least at said contiguous boundary between said second component layer and said first component layer.

38. A method of preparing a magnetic material comprising the steps of:

providing a first component layer having a first atomic structure;

overlaying a second component layer having a second atomic structure non-homogeneous with said first atomic structure of said first component layer on said first component layer, whereby a contiguous boundary is provided between a first surface of said first component layer and a first surface of said second component layer;

whereby said second atomic structure at least where said first surface of said second component layer is contiguous with said first surface of said second layer is influenced by said first atomic structure of said first component layer to increase a magnetostrictive property of said magnetic material.

\* \* \* \* \*